United States Patent
Pascal et al.

(10) Patent No.: US 9,791,478 B2
(45) Date of Patent: *Oct. 17, 2017

(54) CURRENT TRANSDUCER OF THE ROGOWKSI TYPE AND ARRANGEMENT FOR MEASURING A CURRENT

(71) Applicant: ABB Schweiz AG, Baden (CH)

(72) Inventors: Joris Pascal, Baden (CH); Yannick Maret, Dattwil (CH); Jean-Baptiste Kammerer, Lochwiller (FR); Rolf Disselnkotter, Mauer (DE)

(73) Assignee: ABB Schweiz AG, Baden (CH)

( * ) Notice: Subject to any disclaimer, the term of this patent is extended or adjusted under 35 U.S.C. 154(b) by 92 days.

This patent is subject to a terminal disclaimer.

(21) Appl. No.: 14/512,765

(22) Filed: Oct. 13, 2014

(65) Prior Publication Data

US 2015/0028852 A1    Jan. 29, 2015

Related U.S. Application Data

(63) Continuation of application No. PCT/EP2013/000916, filed on Mar. 27, 2013.

(30) Foreign Application Priority Data

Apr. 20, 2012 (EP) ..................... 12002766

(51) Int. Cl.
*G01R 15/18* (2006.01)
*G01R 19/00* (2006.01)
*G01R 35/00* (2006.01)

(52) U.S. Cl.
CPC ....... *G01R 15/181* (2013.01); *G01R 19/0092* (2013.01); *G01R 35/005* (2013.01)

(58) Field of Classification Search
None
See application file for complete search history.

(56) References Cited

U.S. PATENT DOCUMENTS 6,160,697 A * 12/2000 Edel ..................... G01R 15/185
                                                           361/143
6,184,672 B1 * 2/2001 Berkcan ............... G01R 15/181
                                                           324/117 R (Continued)

OTHER PUBLICATIONS

International Search Report (PCT/ISA/210) dated Jul. 30, 2013, by the European Patent Office as the International Searching Authority for International Application No. PCT/EP2013/001133.

(Continued)

*Primary Examiner* — Paresh Patel
(74) *Attorney, Agent, or Firm* — Taft Stettinius & Hollister LLP

(57) ABSTRACT

The invention is about a current transducer of the Rogowski type, with a primary conductor winding having a first number of loops (N1) for carrying the rated current ($I_R$) to be measured, with a secondary conductor winding having a pair of second terminals and a helical shape and a second number of loops (N2), said secondary conductor winding encircling the primary conductor in a toroidal manner, whereby a rated current voltage signal $V_S$ is induced between the pair of second terminals of the secondary winding, said rated current voltage signal being characteristic for the derivative of the rated current ($dI_R/dt$), with a transducer electronics (IED) configured to receive the rated current voltage signal ($V_S$), characterized in that the current transducer comprises a third conductor winding having a pair of third terminals with a third number of loops (N3), whereby the transducer electronics (IED) is configured to feed a calibration current signal ($I_{Cal}$) into the third conductor winding, whereby in response to the derivative of the calibration current signal ($dI_{Cal}/dt$) an additional calibration signal ($V_{cal}$) is created between the pair of second terminals of the second winding and whereby the transducer electronics (IED) is configured to process the rated current voltage (Continued)

Figure 1:
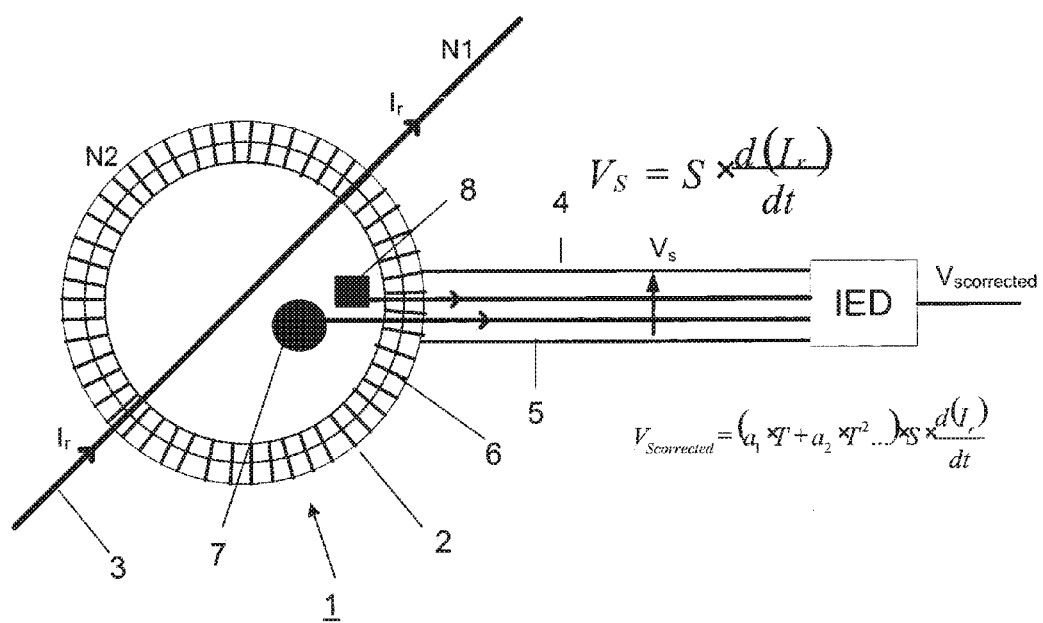

signal ($V_S$) and the calibration signal ($V_{cal}$) to derive a corrected voltage signal ($V_{S,corrected}$) with a calibrated sensitivity $S_{cal}$.

9 Claims, 2 Drawing Sheets

(56) References Cited

U.S. PATENT DOCUMENTS

| | | | | |
|---|---|---|---|---|
| 6,522,517 | B1 * | 2/2003 | Edel | G01R 15/185 |
| | | | | 361/143 |
| 6,624,624 | B1 | 9/2003 | Karrer et al. | |
| 6,954,060 | B1 * | 10/2005 | Edel | G01R 15/183 |
| | | | | 324/117 R |
| 6,963,195 | B1 * | 11/2005 | Berkcan | G01R 15/183 |
| | | | | 324/117 R |
| 6,984,979 | B1 * | 1/2006 | Edel | G01R 15/185 |
| | | | | 324/253 |
| 2004/0140879 | A1 | 7/2004 | Schafer | |
| 2006/0176140 | A1 | 8/2006 | Skendzic et al. | |
| 2008/0007249 | A1 | 1/2008 | Wilkerson et al. | |
| 2008/0302955 | A1 * | 12/2008 | Dzengeleski | H01J 37/1477 |
| | | | | 250/252.1 |

OTHER PUBLICATIONS

International Search Report (PCT/ISA/210) dated Jul. 2, 2013, by the European Patent Office as the International Searching Authority for International Application No. PCT/EP2013/000916.

International Search Report (PCT/ISA/210) dated Jul. 23, 2013, by the European Patent Office as the International Searching Authority for International Application No. PCT/EP2013/000915.

Ramboz, "Machinable Rogowski Coil, Design, and Calibration", IEEE Transactions on Instrumentation and Measurement, Apr. 1, 1996, vol. 45, No. 2, pp. 511-515.

Saroj et al., "P4-13: Development and Calibration of of Rogowski Coils for Pulsed Power Systems", IEEE Vacuum Electronics Conference (IVEC), Feb. 21, 2011, pp. 471-472.

* cited by examiner

CURRENT TRANSDUCER OF THE ROGOWKSI TYPE AND ARRANGEMENT FOR MEASURING A CURRENT

The invention relates to a current transducer of the Rogowski type, with a primary conductor winding having a first number of loops (N1) for carrying the rated current ($I_R$) to be measured, and with a secondary conductor winding having a pair of second terminals and a helical shape and a second number of loops, said secondary conductor winding encircling the primary conductor in a toroidal manner, according to the preamble of claim 1.

The invention further relates to an arrangement for measuring a current, with a current transducer of the Rogowski type and a transducer electronics, according to the preamble of claim 6.

A current transducer of the Rogowski type incorporates a device which is commonly known as a Rogowski Coil. It is widely used as a device for measuring alternating current (AC) or high frequency current pulses. This type of coil has many advantages over other types of current sensors. The Rogowski coils are typically constructed by applying an electrically conductive wire on a non-magnetic and non-conductive carrier. The carrier can be a plastic or glass or ceramic based structure and forms a closed or almost closed loop such that a kind of helical coil wire is formed. The lead from one end of the coil may return through the centre of the coil or close to centre of the coil to the other end, so that both terminals are at the same end of the coil and so that the helical coil itself does not form a closed loop.

The Rogowski coil belongs to the category of air-core coils since the carrier of the coil is non-magnetic, i.e. its magnetic susceptibility is significantly smaller than 1. The carrier may be rigid or flexible and its shape may be a ring, torus, or other.

When placed around a primary conductor carrying an electrical current, the Rogowski coil generates a voltage proportional to the derivative of the current according to the Ampere's law. The voltage is also proportional to the number of turns per unit length and to the area of the turns. The area of one turn is approximately equal to the cross-section area of the coil carrier. Since the voltage induced in the Rogowski coil is proportional to the rate of change of the current in the primary conductor, the output of the coil is typically connected to an electronic device, here called transducer electronics or Intelligent Electronic Device (IED), where the signal is integrated and further processed in order to provide an accurate signal that is proportional to the current.

The Rogowski coil has many advantages over other types of current measuring devices, the most notable being the excellent linearity due to its non-magnetic core, which is not prone to saturation effects. Thus, the Rogowski coil is highly linear even when subjected to large currents, such as those used in electric power transmission, welding, or pulsed power applications. Furthermore, since a Rogowski coil has an air core rather than a magnetic core, it has a low inductance and can respond to fast changing currents. A correctly formed Rogowski coil, with equally spaced windings, is largely immune to electro-magnetic interference. In comparison to conventional ferromagnetic core based current transducers, a Rogowski coil current transducer (RCCT) exhibits a higher dynamic range, lower weight and size, as well as lower production cost.

However, a Rogowski coil current transducer according to the state of the art unfortunately still suffers from moderate accuracy to compete with high conventional ferromagnetic core based current transducers in terms of accuracy, particularly for metering applications. Reason for this is the unknown changes of sensitivity S of Rogowski coils when the environmental conditions are changing, such as temperature, mechanical constraints, humidity, aging etc. Since these non-desirable changes of sensitivity are currently not taken into account by the electronic signal processing in the IED, an alteration in the sensitivity introduces an error on the measurement. Such a limitation impedes reaching high accuracy with a combination of a Rogowski coil current transducer.

One solution to compensate for sensitivity changes of Rogowski coil current transducers known in prior art consists in measuring the temperature with a temperature sensor placed closed to the Rogowski coil. The temperature is then used to compensate the sensitivity according to each Rogowski sensitivity temperature profile. During the characterization of the coil performed at the end of production,—the so called calibration—, the Rogowski coil current transducers sensitivity at ambient temperature as well as its temperature dependency are measured. The coefficients, which give the polynomial correction to apply to the signal in the transducer electronics, are stored in an EEPROM placed in the sensor casing. This solution allows temperature effect compensation, but requires additional production effort, such as calibration and temperature characterization of each Rogowski coil current transducer. Furthermore, it does not allow other compensations such as of mechanical, humidity and aging effects. Indeed, the correction coefficients cannot be updated once the sensor is delivered to the customer. In fact, in order to compensate for aging, the conventional approach requires maintenance effort and an interruption of the rated current measurement on the customer plant. The Rogowski coil current transducer has to be extracted from the plant and recalibrated periodically with the same procedure as the initial calibration in the factory.

The object of the present invention is to provide a Rogowski coil current transducer with an easier ability to calibrate the Rogowski coil sensitivity off-line as well as to calibrate the Rogowski coil sensitivity continuously online, i.e. without interrupting the rated current measurement.

It is an additional object of the present invention to provide an arrangement for measuring a current with a current transducer of the Rogowski type with an easier ability to calibrate the Rogowski coil sensitivity off-line as well as to calibrate the Rogowski coil sensitivity continuously online, i.e. without interrupting the rated current measurement.

According to the invention, the above object concerning an improved Rogowski coil current transducer is achieved by a current transducer of the Rogowski type with the features of claim 1.

The above object concerning an improved arrangement for measuring a current with a current transducer of the Rogowski type is achieved by an arrangement for measuring a current with the features of claim 6.

A current transducer according to the invention comprises a third conductor winding having a pair of third terminals with a third number of loops, wherein the third conductor winding is adapted to receive a calibration current signal ($i_{Cal}$(t)), and wherein the secondary conductor winding (16) is adapted to induce between its pair of second terminals (17,18) a voltage signal $V_S'$, said voltage signal $V_S'$ being a superposition of a rated current voltage signal ($V_S$), being characteristic for the derivative of the rated current ($di_R(t)/dt$), and an additional calibration signal ($V_{cal}$) in response to the derivative of the calibration current signal ($i_{Cal}$(t)).

An arrangement for measuring a current according to the invention comprises a current transducer as described above, with a third conductor winding, and a transducer electronics being adapted to feed the calibration current signal into the third conductor winding, and the transducer electronics being further adapted to receive the voltage signal $V_S'$, and the transducer electronics being further adapted to process the voltage signal $V_S'$ to derive a corrected voltage signal ($V_{S,corrected}$) with a calibrated sensitivity $S_{cal}$.

A current transducer according to the invention provides an easy way of calibrating the sensitivity of the Rogowski coil, by just feeding a calibration current into the third winding. No additional, second measurement technique, like the temperature measurement according to the state of the art, is required. The response of the Rogowski coil to the calibration current in the third winding, measured as additional voltage signal at the terminals of the second winding, is fully compatible from a physical and measuring point of view to the response of the Rogowski coil to the rated current $i_r(t)$ to be measured in the first winding. So there is only a slight adaptation of the transducer electronics required. The response to the calibration current through the third winding will be exposed to the same or nearly identical drifting and aging influences as the response to the rated current through the first winding. This turns the way of calibration according to the invention much more accurate and direct, as compared to the somewhat indirect calibration method by using an extra indication parameter like the temperature.

The third winding in the Rogowski coil transducer according to the invention offers the possibility to calibrate the Rogowski coil sensitivity as well off-line as well as on-line, depending on the way the transducer electronics is designed and the way the calibration procedure is performed. By using the third winding, the sensitivity of the Rogowski coil can be measured and calibrated when the rated current measurement is not running, off-line, for example in the factory at the end of production, or at an installed transducer during an in-field maintenance operation.

The third, additional winding also offers the possibility to continuously measure the sensitivity of the Rogowski coil current transducer without interrupting the rated current $i_r(t)$ measurement. Here the advantage of the invention is to modify an original Rogowski coil design so that it gives to the IED (Intelligent Electronic Device) the possibility to continuously calibrate the Rogowski coil current transducers sensitivity online, i.e. without interrupting the rated current measurement. The invention thus enables to design a Rogowski coil current transducer with an accuracy beyond the performances of a magnetic coil current transducer and to reach IEC60044-8 class 0.2 or better with a Rogowski coil current transducers.

In a preferred embodiment, the third conductor winding is arranged in close proximity to the second conductor winding. Preferably, a stable and accurate calibration current signal $i_{Cal}(t)$ is injected through this third winding N3.

In a preferred embodiment, the third winding N3 covers the full perimeter of the second to conductor winding. This will accurately take into account any possible localized non homogeneity of the secondary winding N2 for the Rogowski coil current transducer sensitivity calculation.

In a preferred embodiment, the current transducer comprises a shield surrounding the secondary winding and the third winding (N3) is placed between the secondary winding (N2) and the shield. Advantage is that the calibration current $i_{Cal}(t)$ can then be smaller and within frequency regions not strongly affected by external perturbations thanks to the shielding.

In a preferred embodiment, the third number of loops N3 is smaller than the second number of loops N2. The third number of loops N3, however, should preferably be large enough to cover the entire perimeter of the Rogowski coil. The ratio N2/N3 can depend on the winding homogeneity of the secondary winding N2. In a preferred embodiment, the ratio between secondary winding loops and third winding loops N2/N3 is the higher the more homogenous the secondary winding N2 is made.

In a preferred embodiment the transducer electronics is adapted to feed the calibration current signal $i_{Cal}(t)$ with an amplitude which is smaller than the amplitude of the rated current ($i_R(t)$, and with a frequency which is higher than the frequency of the rated current $i_R(t)$. Advantage of a smaller amplitude of the calibration current signal $i_{Cal}(t)$ is a lower power consumption in the transducer electronics IED, because $i_{Cal}(t)$ has to be generated in the IED. If for this reason one needs to limit the amplitude $I_{cal}$ of the calibration current signal $i_{Cal}(t)$ to much less than the amplitude $I_R$ of the rated current $i_R(t)$. $i_{cal}(t)$ can be applied at a frequency 10 to 100 times higher than the frequency of the rated current signal. The typical frequency domain of a Rogowski coil current transducer is in the range between 10 Hz . . . 10 kHz. One can assume a linear behavior of the Rogowski coil current transducer in this frequency domain, so the frequency discrepancy between the rated current $i_R(t)$ and the calibration current signal $i_{Cal}(t)$ does not affect significantly the sensitivity estimation, which will be then calculated at a frequency 10 to 100 times higher than the frequency of the rated current. It is even possible to reach a higher frequency, i.e. a smaller current amplitude, while staying in the linear regime.

In a preferred embodiment, the transducer electronics is adapted to apply several calibration current signals with several calibration frequencies sequentially. This may be done in to order to obtain more accurate values for the calibration sensitivitiy $S_{cal}$, also called calibration coefficients.

In a further preferred embodiment the transducer electronics is adapted to subsequently obtain and average values for the calibrated sensitivities $S_{cal}$, in order to obtain improved accuracy.

In a further preferred embodiment, the transducer electronics is adapted to calculate the calibrated sensitivity $S_{cal}$ continuously.

In yet another preferred embodiment, the transducer electronics is adapted to calculate the calibrated sensitivity $S_{cal}$ on a scheduled basis. By calculating the calibrated sensitivity $S_{cal}$ continuously or on a scheduled basis in the IED and applying it to the rated current signal $i_R(t)$, this will ensure a high accuracy of the rated current measurement over changing conditions, such as aging, temperature, mechanical stress or humidity.

Another advantage of the invention is, that the measurement of the rated current signal $i_R(t)$ is not interrupted. It is not influenced by the continuously injected calibration current $I_{cal}$. This principle may therefore be called continuous online calibration.

Figure 2:
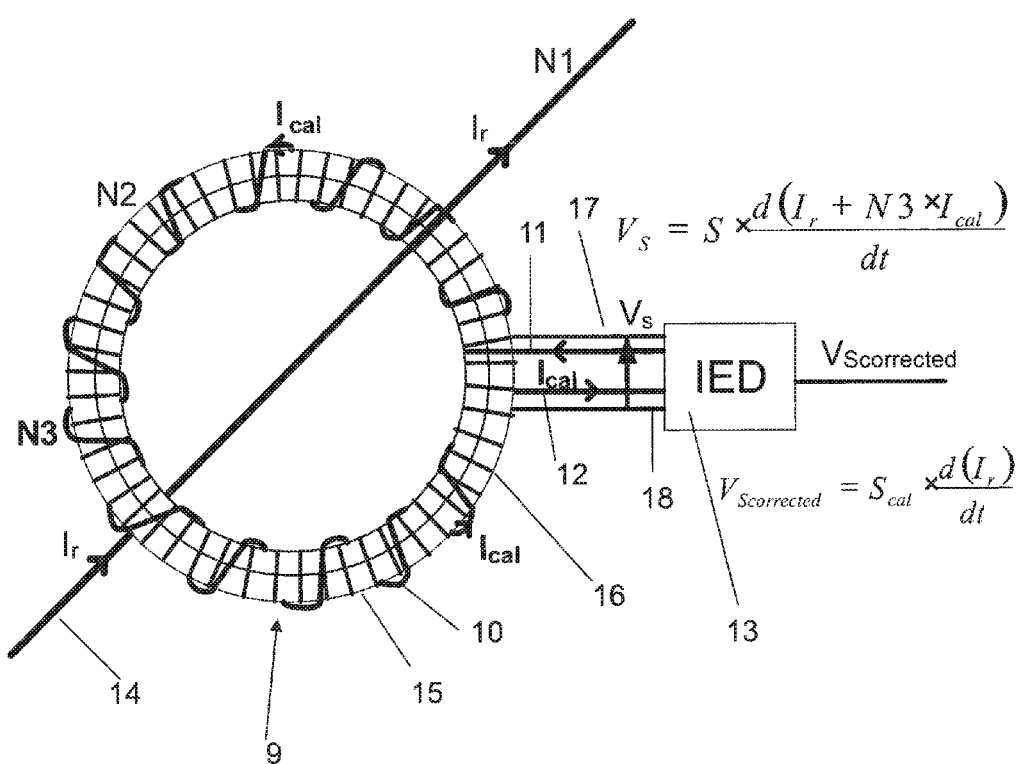

The invention will be described in greater detail by description of an embodiment with reference to the accompanying drawings, wherein FIG. 1. shows the principle of the state of the art Rogowski coil current transducer, and FIG. 2 shows the principle of the Rogowski coil current transducer design according to the invention.

FIG. 1 shows the principle of a state of the art Rogowski coil current transducer 1, where the calibration coefficients are obtained by characterizing the sensors in the factory. The primary conductor 3 carrying the rated current $i_R(t)$ to be measured is passing through the centre of a conventional Rogowski coil 2. Between the pair of secondary terminals 4, 5 of the secondary conductor winding 6 there is a rated current induced voltage signal $V_S$, which can be determined as $V_S = S \times d(i_R(t))/dt$, where S is the sensitivity of the Rogowski coil.

A temperature sensor 7 measuring the temperature is placed closed to the Rogowski coil 2. The rated current voltage signal $V_S$ and the temperature measurement is fed into the transducer electronics IED. In the IED, the temperature measurement is used to compensate the sensitivity S according to each Rogowski sensitivity temperature profile. The coefficients, which give the polynomial correction to apply to the signal in the transducer electronics, are stored in an EEPROM 8 placed in the sensor casing. The corrected sensitivity $S_{corrected}$ consists of a product multiplying the original coil sensitivity S and a correction polynom ($\alpha_1 \times T + \alpha_2 \times T^2 + \ldots$). The corrected rated current voltage signal $V_{Scorrected}$ is then calculated to be $$V_{Scorrected} = Scorrected \times d(i_R(t))/dt = (\alpha_1 \times T + \alpha_2 \times T^2 + \ldots) \times S \times d(i_R(t))/dt$$

The characterization of the coil is performed at the end of production of the coil. During this so called calibration, the Rogowski coil current transducers sensitivity at ambient temperature as well as its temperature dependency are measured. This solution allows temperature effect as well as initial error compensation, initial errors for example due to ambient temperature, but requires additional production effort, such as calibration and temperature characterization of each Rogowski coil current transducer.

So the temperature sensor 7 and the EEPROM 8 containing the coefficients allow online temperature compensation, but no ageing, humidity or mechanical effect are taken into account since the coefficients cannot be dynamically updated.

FIG. 2 shows the principle of a Rogowski coil current transducer (RCCT) 9 design according to the invention. It comprises a Rogowski coil 10, where the primary conductor 14 carries the rated current $i_R(t)$ to be measured and is passing through the centre of the conventional Rogowski coil 15 with the secondary conductor winding 16.

The Rogowski coil current transducer 9 comprises a third conductor winding 10 having a pair of third terminals 11, 12 with a third number of loops (N3).

The transducer electronics (IED) 13 is configured to feed a calibration current signal $i_{Cal}(t)$ into the third conductor winding 10. In response to the derivative of the calibration current signal ($di_{Cal}(t)/dt$) through the third conductor winding 10, an additional calibration signal ($V_{cal}$) is created between the pair of second terminals 17, 18 of the second winding 16: $V_{cal} = N3 \times dI_{cal}/d_t$.

The rated current voltage signal $V_S'$ between the pair of secondary terminals 17, 18 of the secondary conductor winding 16, which is fed into the transducer electronics, can be determined to be $V_S' = S \times (d(i_r(t) + N3 \times i_{Cal}(t))/dt)$, with S being the sensitivity of the Rogowski coil. $V_S'$ can be understood to be a superposition of the rated current voltage signal $V_S = d(i_r(t)/dt)$ and the calibration voltage signal $V_{cal} = N3 \times dI_{cal}/d_t$.

The transducer electronics 13 (IED) is configured to process the rated current voltage signal $V_S'$ and the calibration signal $V_{cal}$ to derive a corrected voltage signal $$V_{S,corrected} = S_{cal.} \times d(i_R(t))/dt, \text{ with a calibrated sensitivity } S_{cal}.$$

So an additional winding N3 is designed for the RCCT, which is fed by a calibration current. The frequency of the calibration current is outside the frequency range of the rated current $i_R(t)$ to be measured. This additional winding offers the possibility to continuously measure within the transducer electronics 13 (IED) the corrected RCCT sensitivity $S_{cal}$ without interrupting the rated current $i_R(t)$ measurement.

An accurate calibration signal $i_{Cal}(t)$ is injected through the additional winding N3. Knowing precisely the number of loops N3 and the current $i_{Cal}(t)$ i.e. its amplitude and frequency, one can separate $i_r(t)$ and $i_{cal}(t)$ within the secondary voltage and detect any changes of the RCCT sensitivity. In this manner a way is provided to calibrate the sensitivity $S_{cal}$ without interrupting the measurement of the rated current $i_R(t)$.

$i_{cal}(t)$ can be much smaller than $i_R(t)$ in amplitude, as smaller currents can be generated in the electronics more easily, and may have a higher frequency. For example for a value of $I_r = 100$ A (amplitude of $i_R(t)$) and $f_r = 50$ Hz, one can choose the combination $f_{cal} > 5$ kHz, $I_{cal} = 10$ mA (amplitude of $i_{cal}(t)$), N3=100 loops. In this manner one has: $d(i_R(t))/dt = N3 \cdot di_{cal}(t)/dt$, so the signal of the calibration current creates about the same signal amplitude as the rated current. This is advantageous for achieving best resolution and accuracy in the calibration. $f_{cal}$ shall be selected outside the specified bandwidth of the primary current in the typical applications, i.e. higher than the highest harmonic to be measured.

So if one needs to limit the amplitude $I_{cal}$ of the current $i_{cal}(t)$ to much less than the amplitude $I_R$ of the rated current $i_R(t)$, which may be required because $i_{cal}(t)$ has to be generated in the transducer electronics IED, $i_{cal}(t)$ can be applied at a frequency 10 to 100 times higher than the rated current signal. Since one can assume a very linear behavior of the Rogowski coil current transducer (RCCT) in its frequency domain, which is typically in a range between 10 Hz and 10 kHz, this frequency discrepancy between $i_R(t)$ and $i_{cal}(t)$ does not affect significantly the sensitivity estimation, which will be then calculated at a frequency 10 to 100 times higher than the rated current frequency. It is even possible to reach higher frequency, i.e. smaller current amplitude, while staying in the linear regime.

In many cases there is an electric shield around the Rogowski coil in order to protect it from electric crosstalk from the primary conductor or from other sources. In this case it is advantageous to put the calibration windings between the shield and the winding N2 in order to protect it from external influences, thus making it easier to perform a clean calibration.

In the case of a very high homogeneity of the winding N2, N3 can be a short cylindrical winding covering just a part of N2.

However, in order to accurately take into account the possible localized nonhomogeneity of the winding N2 for the RCCT sensitivity calculation, it is advantageous that the winding N3 covers the full perimeter of the coil. A reasonable number of loops ratio can be chosen between N2/N3=10 and N2/N3=100. This number of loops contributes also to limit the necessary current amplitude $I_{cal}(t)$. So the number of loops N3 can be smaller than the secondary winding number of loops N2, but N3 should cover the entire RCCT perimeter in order to reduce the effect of winding inhomogeneities. The ratio N2/N3 depends on the expected N2 winding homogeneity. The more homogenous the winding N2 is, the higher N2/N3 (the lower N3) may be.

The winding N3 could be placed between the winding N2 and the shield, thus protecting it from external perturbations.

The signals of the calibration current and the current to be measured are separated in the transducer electronics IED based on frequency separating filters. The signal generated by the calibration current is removed from the output signal of the Rogowski coil sensor. The signal induced by the calibration current is thus used to correct the amplitude of the output signal of the Rogowski coil sensor.

Several calibration frequencies can be sequentially used in order to obtain more accurate calibration coefficients. Alternatively, subsequent calibration coefficients can be averaged in order to improve the accuracy.

The calibrated sensitivity $S_{cal}$ is calculated continuously, or on a scheduled-basis, in the transducer electronics IED and applied to the rated signal $i_R(t)$ ensuring highest accuracy on the rated current measurement over changing conditions, such as aging, temperature, mechanical strain or humidity. If the calibration current is precisely controlled, dimensional changes of the calibration winding due to these influences will not deteriorate the accuracy of the calibration process, The rated current $i_R(t)$ measurement can be never interrupted. It is not influenced by the continuously injected calibration current $i_{cal}(t)$. This principle is called continuous online calibration.

In order to avoid damping and phase shift of the sensor signal, suited measures should be taken to prevent the primary current from inducing currents in the calibration winding. This can be done by inserting an additional effective impedance into the path of the calibration current. This can be achieved with a high pass filter or with an active control of the calibration current, which turns it into an ideal current source.

It is obvious that the calibration procedure as described above in the context of FIG. 2 can be applied on-line or off-line. In case of an off-line calibration the transducer electronics 13 would be connected to the Rogowski coil transducer 9 in an off-line mode, for example in the factory at the end of production, or in the field during an in-field sensor maintenance operation.

LIST OF REFERENCE SIGNS

1 Rogowski coil current transducer
2 Rogowski coil
3 primary conductor
4 secondary terminal
5 secondary terminal
6 secondary winding
7 temperature sensor
8 EEPROM
9 Rogowski coil current transducer
10 third winding
11 third terminal
12 third terminal
13 transducer electronics
14 primary conductor
15 Rogowski coil
16 secondary winding
17 secondary terminal
18 secondary terminal

What is claimed is:

1. An arrangement for measuring a current, with a current transducer of the Rogowski type and a transducer electronics, the current transducer comprising:
   a primary conductor for carrying the rated current to be measured,
   a secondary conductor winding having a pair of second terminals and a helical shape and a second number of loops, said secondary conductor winding encircling the primary conductor in a toroidal manner,
   a third conductor winding having a pair of third terminals with a third number of loops,
   wherein the third conductor winding is adapted to receive a calibration current signal,
   and wherein the secondary conductor winding is adapted to induce between its pair of second terminals a voltage signal, said voltage signal being a superposition of:
      a rated current voltage signal, being characteristic for the derivative of the rated current, and
      an additional calibration signal in response to the derivative of the calibration current signal, and
   the transducer electronics is:
   adapted to feed the calibration current signal into the third conductor winding, adapted to receive the voltage signal, and
   adapted to process the voltage signal to derive a corrected voltage signal with a calibrated sensitivity,
   wherein the transducer electronics is adapted to feed the calibration current signal with an amplitude which is smaller than the amplitude of the rated current, and with a frequency which is higher than the frequency of the rated current.

2. The current transducer according to claim 1, wherein the third conductor winding is arranged in close proximity to the second conductor winding.

3. The current transducer according to claim 1, wherein the third conductor winding covers the full perimeter of the second conductor winding.

4. The current transducer according to claim 1, wherein the current transducer comprises a shield surrounding the secondary winding and whereby the third conductor winding is placed between the secondary winding and the shield.

5. The current transducer according to claim 1, wherein the third number of loops is smaller than the second number of loops.

6. Arrangement according to claim 1, wherein the transducer electronics is adapted to apply several calibration current signals with several calibration frequencies sequentially.

7. Arrangement according to claim 1, wherein the transducer electronics is adapted to subsequently obtain and average values for the calibrated sensitivities in order to obtain improved accuracy.

8. Arrangement according to claim 1, wherein the transducer electronics is adapted to calculate the calibrated sensitivity continuously.

9. Arrangement according to claim 1, wherein the transducer electronics is adapted to calculate the calibrated sensitivity on a scheduled basis.

* * * * *